(12) United States Patent
Shirakawa

(10) Patent No.: US 6,571,465 B1
(45) Date of Patent: Jun. 3, 2003

(54) ELECTRONIC COMPONENT FEEDING AND MOUNTING APPARATUS

(75) Inventor: Tokio Shirakawa, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 308 days.

(21) Appl. No.: 09/614,920

(22) Filed: Jul. 12, 2000

Related U.S. Application Data

(62) Division of application No. 09/242,447, filed as application No. PCT/JP97/02744 on Aug. 7, 1997, now Pat. No. 6,176,011.

(30) Foreign Application Priority Data

Aug. 19, 1996 (JP) .............................................. 8-217177

(51) Int. Cl.[7] ................................................. H05K 3/30
(52) U.S. Cl. ............................. 29/832; 29/743; 29/740; 29/830; 29/832; 29/739; 29/834
(58) Field of Search .......................... 29/743, 740, 739, 29/710, 832, 593, 834, 836; 414/222, 222.01, 222.05, 737

(56) References Cited

U.S. PATENT DOCUMENTS

| 4,501,064 A | 2/1985 | DiNozzi et al. | |
| 5,153,983 A | 10/1992 | Oyama | 29/740 |
| 5,329,692 A * | 7/1994 | Kashiwagi | 29/740 |
| 5,342,460 A | 8/1994 | Hidese | 29/834 |
| 5,410,801 A * | 5/1995 | Shiloh et al. | 29/740 |
| 5,456,001 A * | 10/1995 | Mori et al. | 29/703 |
| 5,457,874 A * | 10/1995 | Yonezawa et al. | 29/740 |
| 5,579,572 A * | 12/1996 | Kashiwagi et al. | 29/740 |
| 5,671,530 A | 9/1997 | Combs et al. | 29/834 |
| 5,727,311 A | 3/1998 | Ida et al. | 29/740 |
| 5,740,604 A | 4/1998 | Kitamura et al. | 29/740 |
| 5,743,005 A | 4/1998 | Nakao et al. | 29/740 |
| 5,778,525 A | 7/1998 | Hata et al. | 29/740 |
| 5,839,187 A | 11/1998 | Sato et al. | 29/759 |
| 5,855,059 A | 1/1999 | Tomagi et al. | 29/740 |
| 5,894,657 A | 4/1999 | Kanayama et al. | 29/740 |

FOREIGN PATENT DOCUMENTS

| JP | 60-242700 | * 12/1985 |
| JP | 1-30298 | * 2/1989 |
| WO | 98/36629 | * 8/1998 |

* cited by examiner

Primary Examiner—Carl J. Arbes
Assistant Examiner—Tai Nguyen
(74) Attorney, Agent, or Firm—Wenderoth, Lind & Ponack, L.L.P.

(57) ABSTRACT

An apparatus includes a component storage device, a transfer head, a component alignment section, and a mounting head. The component storage device houses a plurality of lattice-shaped trays on which electronic components are stored, and can select and eject one of the trays along an ejection direction. The transfer head can move an electronic component from the tray along a first transfer path, while the component alignment section can move the electronic component along a second transfer path. The mounting head can then mount the electronic component on a circuit board.

8 Claims, 3 Drawing Sheets

ELECTRONIC COMPONENT FEEDING AND MOUNTING APPARATUS

This is a Divisional Application of U. S. application Ser. No. 09/242,447 now U.S. Pat. No. 6,176,011, filed Feb. 17, 1999, which is a 371 of PCT/JP97/02744 filed Aug. 7, 1997.

TECHNICAL FIELD

The present invention relates to an electronic component-feeding apparatus and an electronic component mount method used in mounting electronic components to circuit boards.

BACKGROUND ART

FIG. 3 is a diagram showing a constitution of a conventional electronic component-mounting apparatus. A component storage section 3 storing required electronic components 2 is selected from a component storage device 1 which stores several tens of component storage sections 3, and the storage section 3 is sent out in a direction of an arrow I. A mounting head 10 moving freely in X-axis and Y-axis directions sucks components 2 to thereby hold and transfer the electronic components 2. A sucked position of the electronic component 2 is first detected by a position detection camera 7, and thereafter an accuracy of clinched leads of the component or the like is inspected by a good/defective component inspecting device 6. Whether the electronic component 2 is good or fails is thus determined and if the electronic component 2 is defective, the electronic component 2 is removed. A suction attitude and a mount position of the electronic component 2 judged, to be good are corrected on the basis of information of the sucked position obtained by the position detection camera 7. The electronic component 2 is then mounted to a circuit board 11. A plurality of tape-type component feeding devices 12 feeding components stored in a tape, etc. are arranged at an opposite side of the component storage device 1 via a transfer path for the circuit board 11, so that the other components to be mounted to the circuit board 11 are properly supplied and mounted to the circuit board 11 with the use of the aforementioned mounting head 10.

In the prior art constitution as above, a sequence of processes takes time, i.e., a process wherein the component storage device selects the required component storage section, moves the storage section up/down and sends out the storage section through a take-out opening, a process wherein a transfer head sucks the components to thereby hold and transfer the predetermined electronic component, a process wherein the sucked position of the component is detected and corrected so as to inspect whether the component is good or defective, and a process of mounting the component to the circuit board. Productivity efficiency is yet to be solved.

The present invention has for its object to provide an electronic component-feeding apparatus and electronic component mount method of improved efficiency.

SUMMARY OF THE INVENTION

In solving the above-discussed disadvantage, according to a first aspect of the present invention, there is provided an electronic component-feeding apparatus which comprises component storage sections, a component storage device, transfer head, a component alignment section, and an inspection device.

The component storage sections store electronic components. The component storage device has a plurality of the component storage sections therein, and selects and sends out a desired component storage section therefrom.

The transfer head has a suction nozzle for sucking a predetermined electronic component from the component storage section selected and sent out by the component storage device, thereby transferring the predetermined electronic component to a component alignment section. The component alignment section holds the electronic components sequentially transferred by the transfer head, and transfers the held electronic components sequentially to a suction position of amounting head.

The inspecting device is for inspecting whether the electronic component is good or defective on a transfer path of the transfer head. By the above construction of the aspect of the present invention, the electronic components can be aligned in the order of mounting at the component alignment section at the same time that a circuit board is carried in or discharged. Therefore, the electronic components are efficiently supplied to the mounting head when the electronic components are mounted to the circuit board. Thus, efficiency in mounting the electronic components is improved greatly. In addition to this effect, the electronic components can be inspected before being supplied to the mounting head. Thus, efficiency is furthermore enhanced.

According to a second aspect of the present invention, the component alignment section of the first aspect of the present invention includes a component alignment belt and alignment suction nozzles arranged in a row at a constant interval on the component alignment belt along a transfer direction of the component alignment belt. Therefore, the electronic components are supplied sequentially to the mounting head through an intermittent operation of the component alignment belt. By the above construction, the electronic components can accordingly be efficiently and surely supplied to the mounting head in a state while aligned in the order of mounting.

According to a third aspect of the present invention, in the electronic component-feeding apparatus in the first or second aspect of the present invention, the transfer direction of the component alignment belt of the component alignment section is oriented in parallel to a direction in which the selected component storage section is sent out from the component storage device. In addition, the transfer head moves in a direction orthogonal to the send-out direction. By the above construction, the electronic components can be aligned on the component alignment section efficiently in the order of mounting through a reciprocatory operation of the transfer head.

According to a fourth aspect of the present invention, an electronic component mount method carried out when electronic components are mounted to a circuit board is provided. This method comprises selecting a desired one of a plurality of component storage sections storing the electronic components, and taking out the electronic component selected among the electronic components in the selected component storage section on the basis of the order of mounting to the circuit board. The electronic component is then transferred and delivered to a component alignment section. The selecting, taking out, transferring and delivering operations are repeated in accordance with the order of mounting. The electronic components sequentially transferred to the component alignment section are held, and the held electronic components are supplied sequentially to a suction position of a mounting head by the component alignment section.

The electronic components are then sucked sequentially at the suction position and are mounted to the circuit board by the mounting head. By the above constructions, the electronic components can be efficiently supplied to the mounting head in a state while aligned in the order of mounting at the same time that the circuit board is carried in or out. In consequence, the electronic components are mounted efficiently to the circuit board.

According to a fifth aspect of the present invention, while the electronic component is being transferred to the component alignment section, the electronic component is inspected to determine whether it is good or not. By the above constructions, whether or not the electronic component is good is determined before it is supplied to the mounting head, thereby enhancing efficiency.

According to a sixth aspect of the present invention, in any one of the first through third aspects of the present invention, the transfer head repeatedly takes out the electronic components in accordance with the order in which they are mounted to the circuit board. The transfer head also repeatedly transfers the electronic component to the component alignment section and delivering the electronic component to the component alignment section in the order in which they are to be mounted. The electronic components can accordingly be delivered to the component alignment section among the electronic components in the component storage section in accordance with the order of mounting to the circuit board.

As described hereinabove, in the electronic component-feeding apparatus and the electronic component mount method provided according to the present invention, the time during which the circuit board is carried in or out, etc. is efficiently utilized to feed the electronic components to the mounting head in a state while the electronic components are aligned in the order of mounting. A mount time for the electronic components in a mount process is consequently greatly reduced, and productivity is expected to be improved. Moreover, the good/defective inspection of the electronic components can be accomplished before they are aligned in the order of mounting, achieving further improvement in efficiency.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
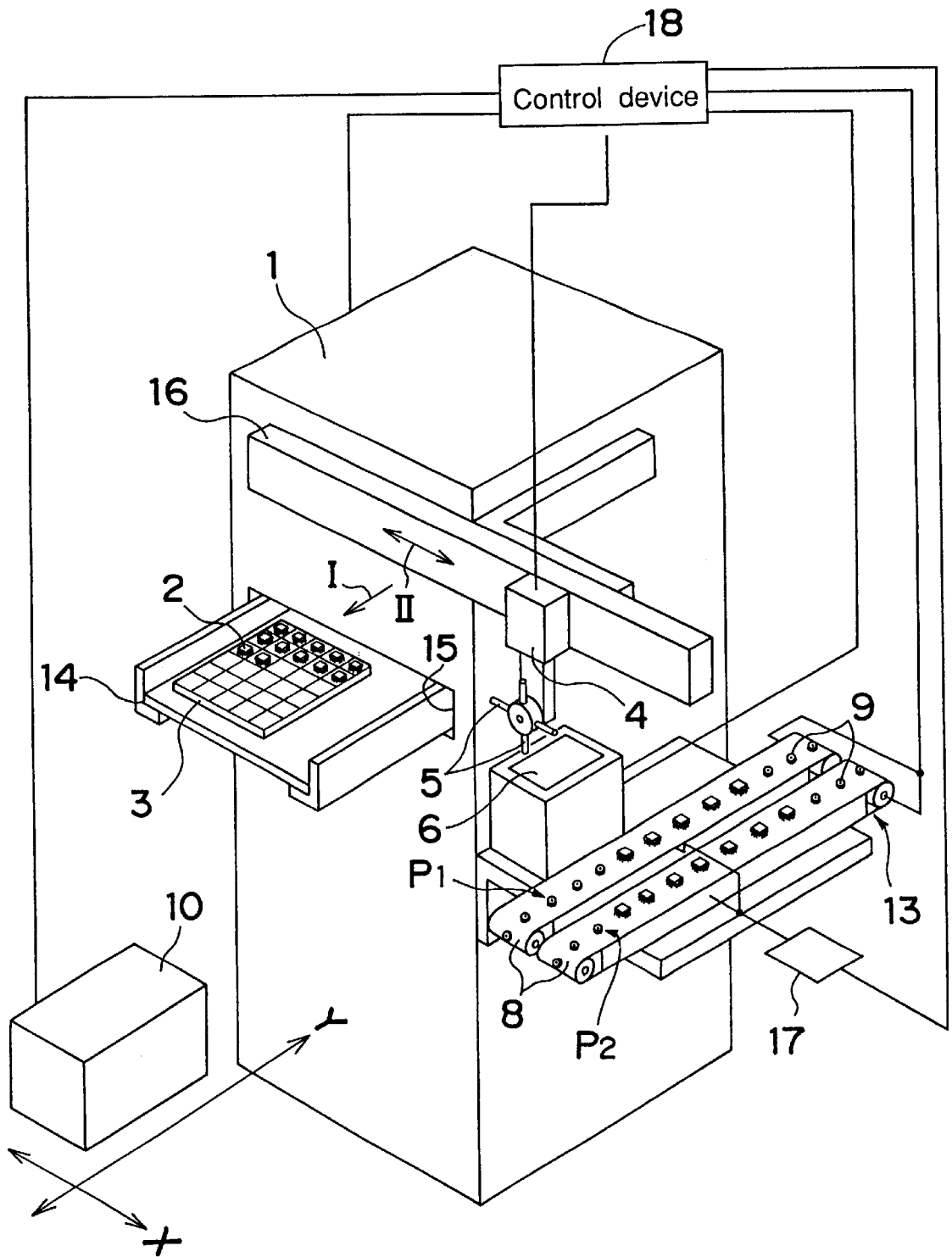
FIG. 1 is a perspective view of an electronic component-feeding apparatus in an embodiment of the present invention.

Before the description of the present invention proceeds, it is to be noted that like parts are designated by like reference numerals throughout the accompanying drawings.

Preferred embodiments of the present invention will be described hereinbelow with reference to FIGS. 1 and 2 in which the same members as in the conventional art are designated by the same reference numerals.

In FIG. 1, a component storage device 1 holds several tens of component storage sections 3 (such as lattice-shaped trays or the like) storing electronic components 2 therein. The layered storage sections 3 are held in the device 1 in a manner so as to be movable up and down. The component storage section 3 storing a required electronic component is designated according to a program, and then is moved up and down and carried to a take-out opening 15 by moving up and down a component storage section-supporting shelf 14 supporting the component storage section 3. The component storage section 3 is discharged out in an ejection direction of an arrow I through the take-out opening 15. A transfer head 4 having several kinds of transfer suction nozzles 5 takes out the electronic component 2 from the component storage section 3 by using an optimum nozzle conforming to a type of the electronic component 2, transfers the electronic component along a first transfer path in a direction of an arrow II along a guide rail 16, and passes the electronic component over a good/defective component-inspecting device 6 arranged at a location corresponding to a transfer path of the electronic component so as to inspect whether the electronic component is good or defective. The electronic component 2 is moved along the first transfer path to a component alignment section 13 when the component is good, whereas a defective electronic component 2 is eliminated by a removing means (not shown in the drawing).

The good/defective component-inspecting device 6 scans the electronic component 2 with laser light shining in a direction orthogonal to the arrow direction II when the electronic component 2 transferred in the direction II passes over the inspecting device 6. Thus, inspections are conducted on the following inspection items on the basis of a light-receptive position and a light-receptive amount of a reflected laser light of the scan. The inspection items referred to above include a lead pitch, a lead count, a lead bend in a thicknesswise direction of the electronic component etc. in the case of the electronic component 2 having leads. For the electronic component 2 with solder balls or bumps, the inspection items include a lack or break, a height, and a shape of the solder ball or bump. Inspection information from the inspecting device 6 is supplied to a control device 18 which judges whether the electronic component 2 is good or defective.

The component alignment section 13 has two component alignment belts 8. A plurality of alignment suction nozzles 9 are arranged at a constant interval on each component alignment belt 8. The component alignment section 13 moves the electronic components 2 along a second transfer path to suction positions P1, P2 of a mounting head 10 sequentially through intermittent driving via a constant pitch by the alignment belts 8. A suction device 17 is connected to each component alignment belt 8. The alignment suction nozzles 9 suck the components 2 to thereby hold the electronic components 2 by the suction device 17. As can be seen in FIG. 1, the second transfer path is substantially parallel to the ejection direction indicated by arrow I, while the first transfer path is substantially orthogonal to the ejection direction indicated by arrow I.

The control device 18 controls the above-described operations of at least the component storage device 1, transfer head 4, good/defective component/inspecting device 6, mounting head 10, component alignment section 13 and suction device 17. The control device 18 can also control operations of a position detection camera 7 and a transference of the circuit board 11 as described later. A mount program containing information regarding a relationship of mount positions on the circuit board including the order of mounting, containing information about the types of the electronic components to be mounted at the mount positions, and containing information related to a mount operation such as types of electronic components stored in the component storage sections 3, etc. are stored in the control device 18 before the mounting is started.

Figure 2:
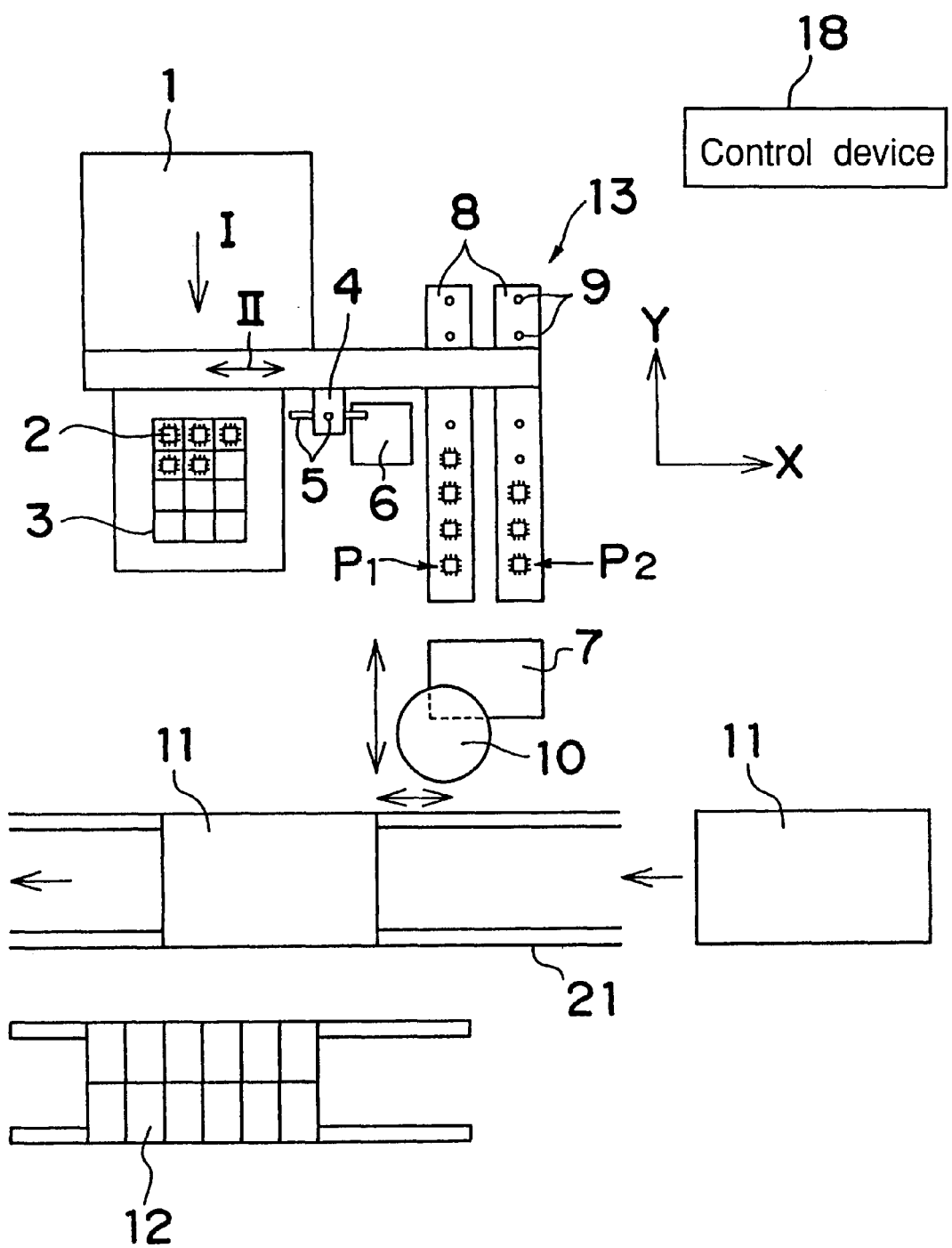
FIG. 2 is a diagram of the constitution of an electronic component-mounting apparatus according to an embodiment of the present invention which includes the electronic component-feeding apparatus of FIG. 1.
Figure 3:
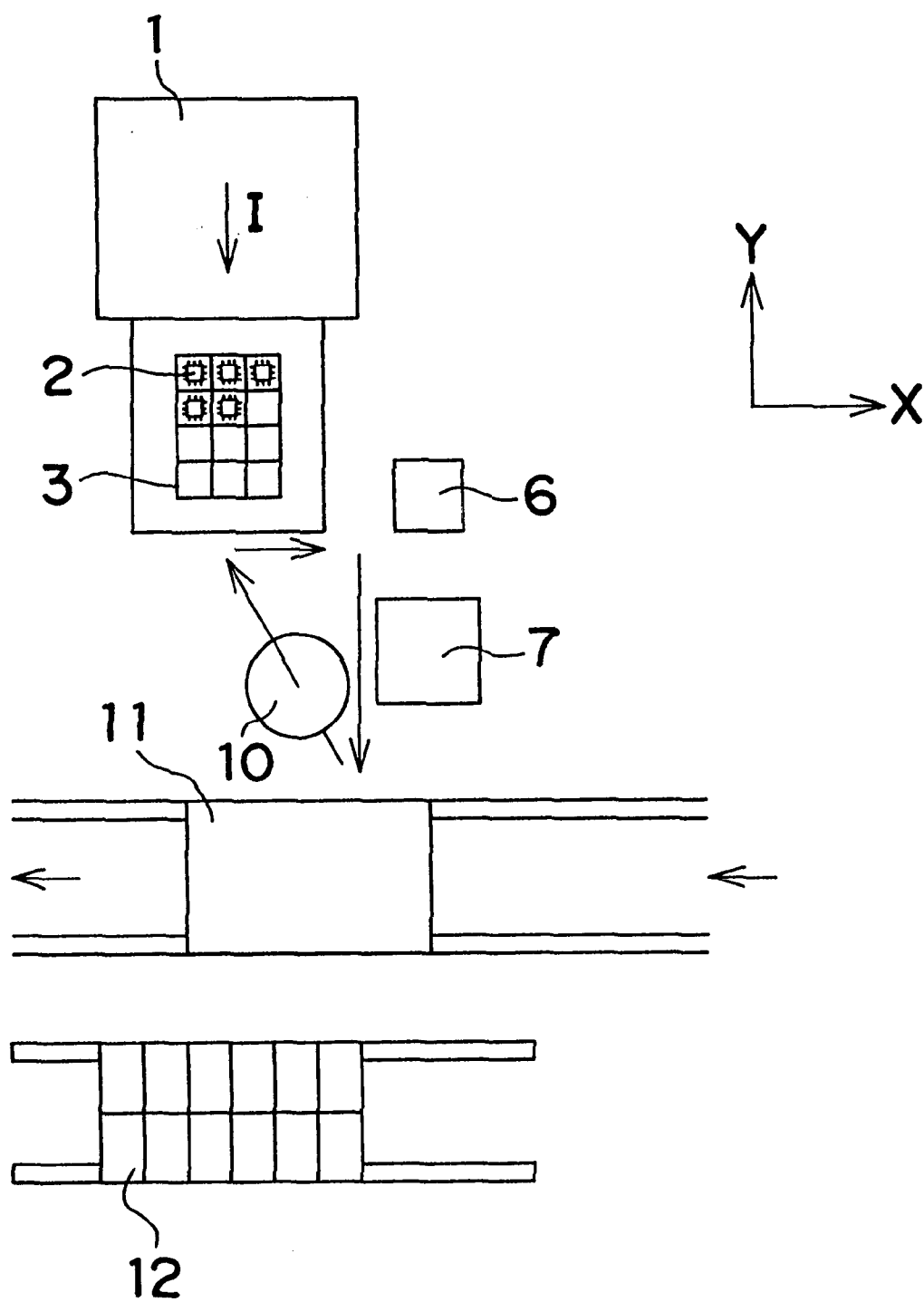
FIG. 3 is a diagram of the constitution of a conventional electronic component-mounting apparatus.

FIG. 2 is a diagram showing the constitution of an electronic component-mounting apparatus in an embodiment of the present invention including the electronic component-feeding apparatus. Reference number 12 denotes a tape-type or stick-type component feeding apparatus. The component storage device 1 is set at the opposite side of the circuit board 11 to the feeding apparatus 12 via a circuit board feed path 21. The component alignment section 13 is arranged in parallel to the component storage device 1, and the good/defective component-inspecting device 6 is positioned between the component storage section 3 and the component alignment belt 8. The position detection camera 7 for correction of the component sucked position is placed between the component alignment belts 8 and circuit board 11.

During the time when the circuit board 11 is moved out after a component has been mounted thereto and a fresh circuit board 11 is carried in, or when the mounting head 10 mounts a different electronic component supplied from the tape-type or stick-type component feeding apparatus 12 to the circuit board 11, the transfer head 4 takes out an electronic component 2 from the component-storage section 3. The electronic component 2 is then inspected by the good/defective component-inspecting device 6 installed in the middle of the transfer path, and if the electronic component 2 is good, the transfer head 4 transfers the electronic component 2 to the alignment suction nozzle 9 on the alignment belt 8. The above operation is repeatedly carried out a predetermined number of times. Thus, after the inspection, the electronic components 2 can be aligned sequentially on the component alignment belts 8 in the programmed order of mounting, and can be sucked and held by the alignment suction nozzles 9. Through the intermittent feeding by the component alignment belts 8, the electronic components 2 are sent towards the mounting head 10 by every one pitch. Therefore, in this constitution, the time for carrying in and out the circuit board 11 can be utilized efficiently, and the mounting head 10 merely reciprocates between a leading end of the alignment belts 8 at the side of the mounting head 10 and the circuit board 11. As a result, an increase in speed of the mounting operation is achieved.

According to the above arrangement, even in the case of electronic components of a large size requiring that the component storage device have trays layered therein, a predetermined electronic component can be taken out, transferred and mounted in short time. Therefore, the large electronic components can be supplied efficiently in the same manner as in the tape-type or stick-type component feeding apparatus.

Although the component alignment section uses two component alignment belts in the above description, one component alignment belt or two or more belts can act in the same way.

In the embodiment, the good/defective component inspecting device is located between the component storage device and component alignment belt. However, the arrangement is not required. For instance, the inspecting device may be set at the component alignment section.

Further, the tape-type or stick-type component feeding apparatus is employed together in the embodiment. However the electronic component-feeding apparatus of the present invention may be used singly in the electronic component-mounting apparatus, which fulfills the same effect.

The mounting head adopted in the embodiment moves in the X-axis and Y-axis directions. Other kinds of mounting heads (e.g., a rotary head and the like) are applicable to the electronic component-feeding apparatus of the present invention.

The entire disclosure of Japanese Patent Application No. 8-217177 filed on Aug. 19, 1996 including the specification, claims, drawings and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

I claim:

1. An electronic component-feeding apparatus comprising:

a component storage device housing a plurality of lattice-shaped trays for storing electronic components, said component storage device being operable to select a desired one of said lattice-shaped trays by moving said lattice-shaped trays in a vertical direction, and being operable to eject the desired one of said lattice-shaped trays along an ejection path;

a transfer head having a suction nozzle for sucking an electronic component from the ejected one of said lattice-shaped trays;

a component alignment section including a component alignment belt having alignment suction nozzles spaced apart thereon, said transfer head being operable to transfer the sucked electronic component along a first transfer path from the ejected one of said lattice-shaped trays to said component alignment section, said alignment suction nozzles of said component alignment section being operable to hold the transferred electronic component in a predetermined alignment, said component alignment belt being operable to move the held electronic component along a second transfer path, wherein said component storage device, said transfer head, and said component alignment section are arranged such that the first transfer path is substantially orthogonal to the ejection path, and such that the second transfer path is substantially parallel to the ejection path; and a mounting head for mounting the electronic components, said component alignment section being operable to sequentially convey a plurality of held electronic components along the second transfer path to a suction position of said mounting head in an order in which said mounting head mounts the electronic components.

2. The apparatus of claim 1, wherein said transfer head includes a plurality of types of suction nozzles for sucking a predetermined electronic component from the ejected one of said lattice-shaped trays, said plurality of types of suction nozzles including a first type of suction nozzle for sucking a first type of electronic component, and including a second type of suction nozzle for sucking a second type of electronic component;

wherein said transfer head is operable to suck the first type of electronic component using said first type of suction nozzle and suck the second type of electronic component using said second type of suction nozzle so as to sequentially align the first type of electronic component and the second type of electronic component on said component alignment belt of said component alignment section in said order in which said mounting head mounts the electronic components.

3. The apparatus of claim 2, wherein said alignment suction nozzles are arranged on said component alignment belt in a row and evenly spaced at constant intervals along the second transfer path, said component alignment section being operable to intermittently operate so as to sequentially supply the held electronic components to said mounting head.

4. The apparatus of claim 3, further comprising an inspecting device arranged along the first transfer path for inspecting the electronic component and determining whether the electronic component is a good component or a defective component.

5. The apparatus of claim 4, wherein said component alignment section includes two component alignment belts, each of said component alignment belts having alignment suction nozzles spaced apart thereon.

6. The apparatus of claim 1, wherein said alignment suction nozzles are arranged on said component alignment belt in a row and evenly spaced at constant intervals along the second transfer path, said component alignment section being operable to intermittently operate so as to sequentially supply the held electronic components to said mounting head.

7. The apparatus of claim 6, further comprising an inspecting device arranged along the first transfer path for inspecting the electronic component and determining whether the electronic component is a good component or a defective component.

8. The apparatus of claim 7, wherein said component alignment section includes two component alignment belts, each of said component alignment belts having alignment suction nozzles spaced apart thereon.

* * * * *